United States Patent [19]

Leibman

[11] Patent Number: 5,014,319

[45] Date of Patent: May 7, 1991

[54] FREQUENCY TRANSPOSING HEARING AID

[75] Inventor: Vadim Leibman, Nof Haemak, Israel

[73] Assignee: AVR Communications Ltd., Haifa, Israel

[21] Appl. No.: 283,971

[22] Filed: Dec. 13, 1988

[30] Foreign Application Priority Data

| | | | |
|---|---|---|---|
| Feb. 15, 1988 | [IL] | Israel | 85417 |
| Sep. 19, 1988 | [IL] | Israel | 87814 |
| Oct. 6, 1988 | [IL] | Israel | 87956 |

[51] Int. Cl.[5] .......... H04R 25/00; H03G 5/00

[52] U.S. Cl. .......... 381/68.2; 381/68; 381/98

[58] Field of Search .......... 381/68.2, 68, 68.4, 381/98, 103, 83, 93, 67

[56] References Cited

U.S. PATENT DOCUMENTS

| | | | |
|---|---|---|---|
| 4,025,723 | 5/1977 | Blackledge | 381/68.2 |
| 4,051,331 | 9/1977 | Strong et al. | 381/68 |
| 4,052,571 | 10/1977 | Gregory et al. | 381/68.2 |
| 4,187,413 | 2/1980 | Moser | 381/68 |
| 4,220,160 | 9/1980 | Kimball et al. | 381/67 |
| 4,271,331 | 6/1981 | Kalkstein | 381/54 |
| 4,366,349 | 12/1982 | Adelman | 381/68.2 |
| 4,393,275 | 7/1983 | Feldman et al. | 381/68 |
| 4,419,544 | 12/1983 | Adelman | 381/68.2 |
| 4,425,481 | 1/1984 | Mansgold et al. | 381/682 |
| 4,622,440 | 11/1986 | Slavin | 381/68.2 |
| 4,630,304 | 12/1986 | Borth et al. | 381/68 |
| 4,630,305 | 12/1986 | Borth et al. | 381/68.2 |
| 4,637,402 | 1/1987 | Adelman | 381/68.2 |
| 4,680,798 | 7/1987 | Neumann | 381/68.2 |
| 4,689,818 | 8/1987 | Ammitzboll | 381/68.2 |
| 4,843,623 | 6/1989 | Lafon et al. | 381/68.2 |

FOREIGN PATENT DOCUMENTS

| | | | |
|---|---|---|---|
| 54450 | 7/1984 | European Pat. Off. . | |
| 2716336 | 7/1978 | Fed. Rep. of Germany . | |
| 3205686 | 8/1983 | Fed. Rep. of Germany . | |
| 2364520 | 9/1976 | France . | |
| 2571580 | 4/1986 | France . | |
| 282335 | 9/1988 | France | 381/68 |
| 8304846 | 11/1987 | Sweden . | |

OTHER PUBLICATIONS

Max Velmans, "The Design of Speech Recoding Devices for the Deaf*", British Journal of Audiology, 1974, 8. p. 1.

Max Velmans, "Effects of Frequency 'Recoding' on the Articulation Learning of Perceptively Deaf Children", pp. 180–181.

Bennett and Byers, "Increased Intelligibility in the Hypacusic by Slow-Play Frequency Transposition", The Journal of Auditory Research, 1967, pp. 107–109.

Max Velmans and Merle Marcuson, "The Acceptability of Spectrum-Preserving and Spectrum-Destroying Transposition to Severely Hearing-Impaired Listeners", British Journal of Audiology, 1983, pp. 17–19.

Guttman, Levitt, and Bellefleur, "Articulatory Training of the Deaf Using Low-Frequency Surrogate Fricatives", May 27, 1969, pp. 19, 21 and 29.

*Primary Examiner*—Jin F. Ng

*Assistant Examiner*—Jason Chan

*Attorney, Agent, or Firm*—Abelman, Frayne, Rezac & Schwab

[57] ABSTRACT

The described hearing aid includes a frequency analyzer for classifying incoming sounds according to their frequency, and for selecting an appropriate transposition factor (the ratio of the information storage rate to the information retrieval rate) according to the appropriate one of several transposition factors inputted into the hearing aid based on the particular user's hearing characteristics for different frequencies. Also, described is an arrangement for minimizing loss of speech components containing the same frequency information by recirculating such speech components. Further described is an arrangement for reconstructing portions of the speech components according to their classification by the frequency analyzer in order to minimize loss of useful information in the output signal.

21 Claims, 13 Drawing Sheets

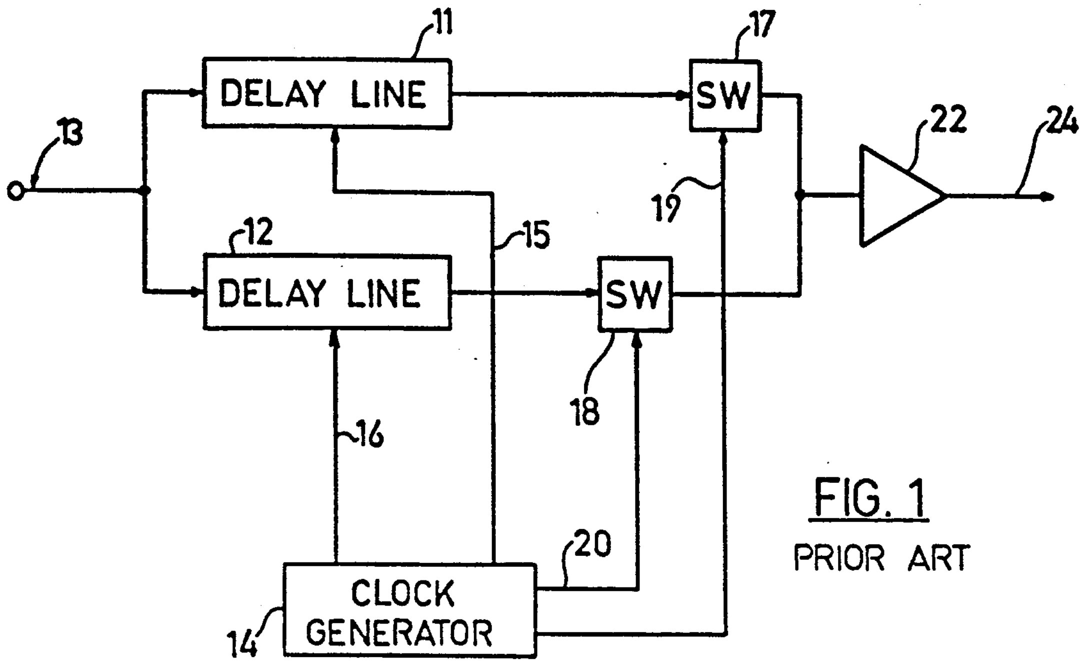
FIG. 1
PRIOR ART
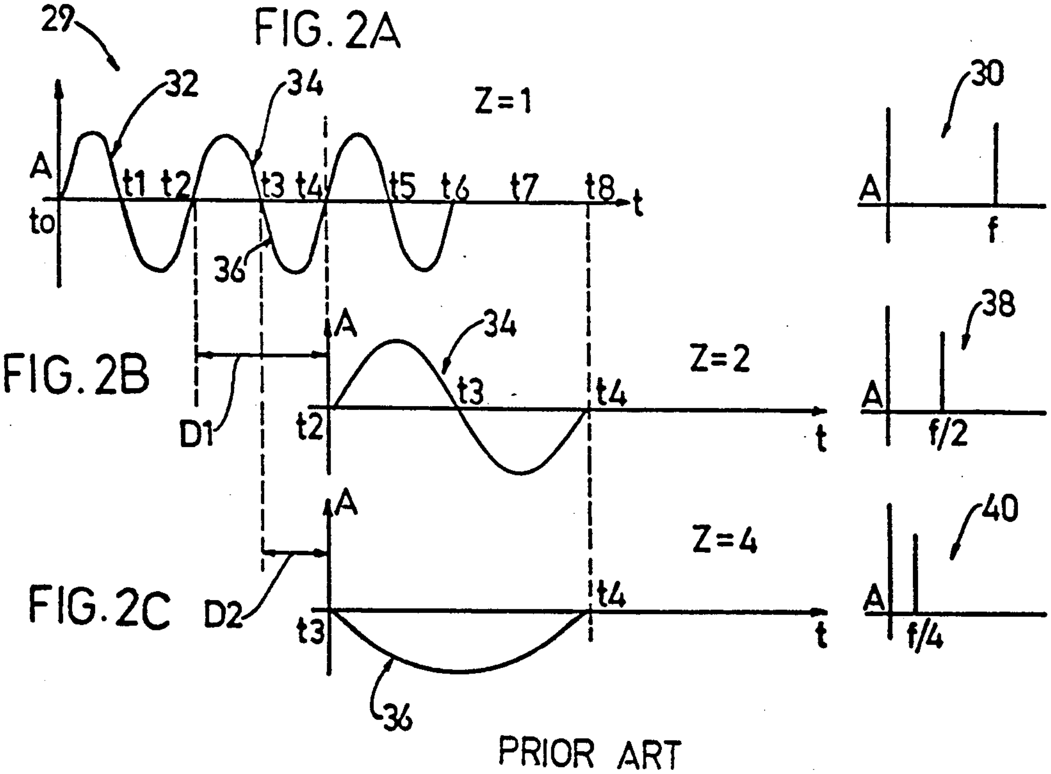
FIG. 2A
FIG. 2B
FIG. 2C
PRIOR ART

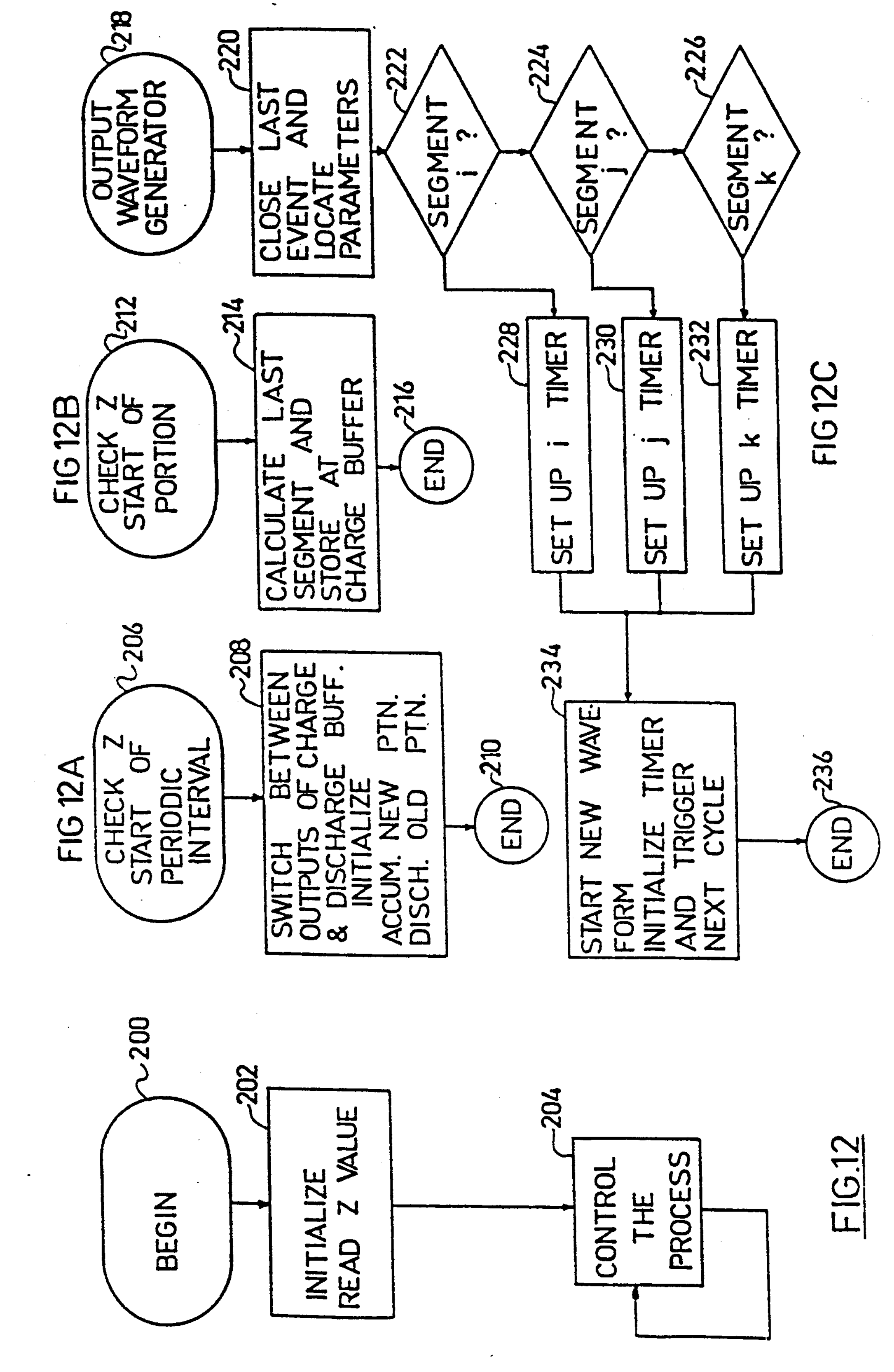

BEGIN
200
INITIALIZE READ Z VALUE
202
CONTROL THE PROCESS
204
FIG.12
FIG 12A
CHECK Z START OF PERIODIC INTERVAL
206
SWITCH BETWEEN OUTPUTS OF CHARGE & DISCHARGE BUFF. INITIALIZE ACCUM. NEW PTN. DISCH. OLD PTN.
208
END
210
FIG 12B
CHECK Z START OF PORTION
212
CALCULATE LAST SEGMENT AND STORE AT CHARGE BUFFER
214
END
216
OUTPUT WAVEFORM GENERATOR
218
CLOSE LAST EVENT AND LOCATE PARAMETERS
220
SEGMENT i ?
222
SEGMENT j ?
224
SEGMENT k ?
226
SET UP i TIMER
228
SET UP j TIMER
230
SET UP k TIMER
232
START NEW WAVE FORM INITIALIZE TIMER AND TRIGGER NEXT CYCLE
234
END
236
FIG 12C

FREQUENCY TRANSPOSING HEARING AID

FIELD OF THE INVENTION

The present invention relates to hearing aid devices, and more particularly, to an improved hearing aid incorporating a frequency transposing operation enabling a user whose hearing capability is limited to a narrow frequency band to hear information contained in a wide range of audio frequencies.

BACKGROUND OF THE INVENTION

There are known hearing aid circuits which provide frequency shifting of analog signals in a real time manner for reducing the frequency of such signals for a person having limited frequency audibility. Examples of such circuits are found in U.S. Pat. No. 4,271,331 to Kalkstein, U.S. Pat. No. 4,366,349 to Adelman and U.S. Pat. No. 4,419,544 to Adelman. Typically the frequency shifting is produced by using a multi-element storage component such as a conventional serial analog delay element. The signal moves through each serial memory in a "bucket brigade" fashion in response to clock pulses. The timing of the clock pulses is varied in order to achieve desired delays and frequency shifts.

The above technique has a significant disadvantage. Due to the fact that frequency reduction is produced by setting the clocking-out rate from the delay element to be slower than the clocking-in rate thereto, there is necessarily a loss of information which is related to the amount of frequency reduction. This loss of information arises due to the fact that more information is being supplied to the delay element than is being read out therefrom.

SUMMARY OF THE INVENTION

Accordingly, it is a principal object of the present invention to overcome the above-mentioned disadvantage and provide a hearing aid featuring a frequency transposition function which changes the audio frequencies contained within input speech components and enables a user to hear information contained therein within a frequency band associated with hearing capability, while maintaining acceptable speech intelligibility.

In accordance with the invention, there is provided hearing aid apparatus to facilite hearing by a user, comprising: converting means for converting inputted audio frequency sounds to electrical input signals; storage means for storing information associated with the electrical input signals; and control means for controlling the storage means to store information at a predetermined information storage rate and to output the stored information at a predetermined information retrieval rate, the ratio of the information storage rate to the information retrieval rate being termed the transposition coeffecient. The control means includes input means for inputting at least two different transposition coefficients predetermined according to the user's hearing characteristics for different frequency ranges; frequency analyzer means for classifying incoming audio frequency sounds according to their frequency, and for selecting the appropriate transposition coefficient according to the frequency of the incoming signal; and clock generator means for generating clocking signals applied to the storage means at a clock rate determining the information storage rate and the information retrieval rate according to the selected transposition coefficient.

In a preferred embodiment, the hearing aid incorporates electronic circuitry integrated in a hearing aid or transmitting thereto, which changes the audio frequencies contained within input speech components (or phonemes) of a speech pattern represented by an input information waveform by using different clocking rates for information storage and retrieval. The information storage and retrieval clocking rates are applied to govern the operation of a pair of storage devices.

For example, a pair of analog delay lines can be configured in a switched push-pull arrangement, whereby one delay line stores input information at one clock rate while information is retrieved at the output of the second one at a different rate. The same effect can be achieved by a pair of memory devices which receive information at a clocking-in rate from respective A/D converters and feed it to respective D/A converters at a clocking-out rate which is different. The basic operation is termed "frequency transposition".

If the clocking-out rate is slower than the clocking-in rate by a predetermined ratio, frequency transposition results in reduction of the frequency and effectively allows the user to hear the higher frequencies contained within speech components in a lower audio frequency range. The predetermined ratio is termed herein as the "transposition coefficient."

In accordance with a preferred embodiment of the invention, the control means further includes recirculating means for recirculating information originally stored in the storage means back to the storage means.

In this way speech components containing the same frequency spectrum as information "lost" in prior art embodiments is preserved in the output signal.

The system also provides the capability of raising the frequencies contained within input speech components by using an output clock rate faster than that used on the input. This would allow a user having "middle" range hearing capability to hear low frequencies contained within input speech components in a higher frequency range.

In another alternative embodiment the control means further includes reconstruction means for reconstructing the inputted audio frequency sounds while preserving its frequency pattern by controlling the storage of only portions of the freqency components contained in the inputted audio frequency sounds according to their classification by said frequency analyzer means, the time period of each portion being proportioned to the transposition coefficient, the disadvantage of lost information is overcome by a reconstruction method wherein portions of the input speech components are stored based on the pattern of their frequency spectra. The storage device is controlled such that it operates based on recognition of the time interval between changes in the input frequency spectrum as detected by the frequency analyzer. The clocking-in operation is carried out for only a portion of this interval relative to the size of the transposition coefficient.

During the remaining portion of the time interval the clocking-in operation ceases until a new input frequency change is detected. Thus, only a portion of the information enters the storage device, and this portion contains a group of signal frequency components taken from the input speech which preserve the pattern of frequency spectra for information retrieval purposes.

According to another feature in a preferred embodiment of the invention described below, the control means further includes approximator means which is operative to combine the output from the storage means at the time of switching between retrieval and storage in order to smooth the output from the storage means.

The system provides practical elimination of unwanted acoustic feedback to the user for high frequency signals. When such signals are detected by the frequency analyzer, the frequency transposition operation is maintained for an additional fixed interval beyond the duration of the input signal itself, thereby reducing the input signal to a lower frequency and preventing reamplification of any stray "echoes" so that the signal does not "feed" on itself.

Additionally in order to avoid unwanted acoustic feedback, a noise generator may be provided to constantly vary by a small amount the relationship between the clocking in rate and the clocking out rate.

In the described preferred embodiments, the inventive hearing aid is designed to be worn as a device useful for ordinary conversation.

Other features and advantages of the invention will become apparent from the drawings and the description contained hereinbelow.

BRIEF DESCRIPTION OF THE DRAWINGS

For a better understanding of the invention, reference is made to the accompanying drawings, in which like numerals refer to corresponding elements or sections throughout, and in which: .

FIG. 1 is a schematic block diagram of a part of prior art hearing aid apparatus;

FIG. 2A shows an input information waveform having amplitude and frequency characteristics associated with sounds provided as input to the prior art apparatus of FIG. 1;

FIGS. 2B and 2C show the amplitude and frequency characteristics associated with output signals produced by the prior art apparatus of FIG. 1 through frequency transposition of the input information waveform of FIG. 2A;

FIG. 4 shows an input information waveform having amplitude and frequency characteristics associated with sounds provided as input to the hearing aid of FIG. 3;

FIGS. 12 and 12A-12C are flowcharts of an algorithm controlling the operation of a microcontroller operative in accordance with the timing diagrams of FIG. 11A-11G.

DETAILED DESCRIPTION OF A PREFERRED EMBODIMENT

Figures 3, 3A:
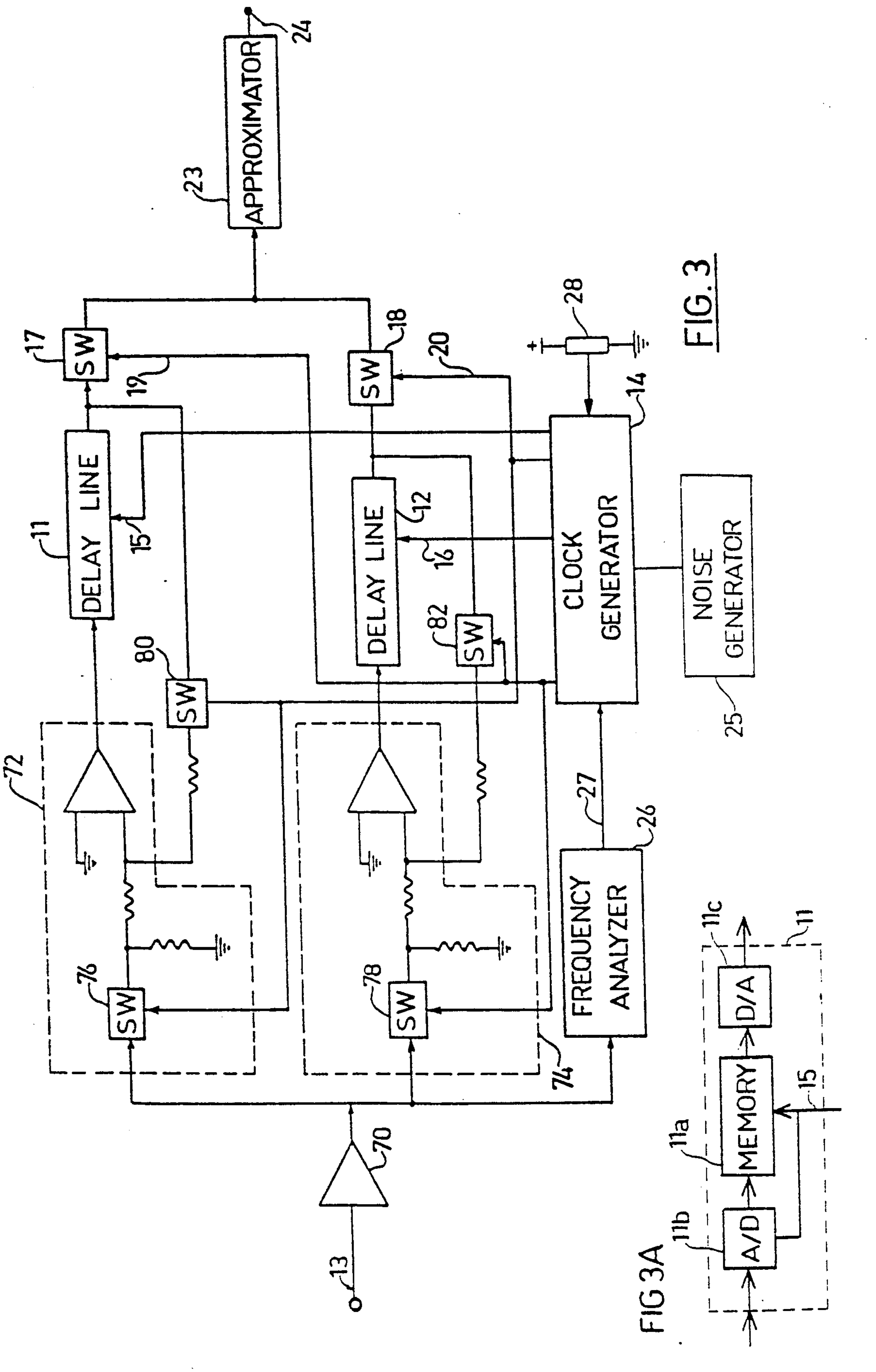
FIG. 3 shows a schematic block diagram of a hearing aid constructed and operative in accordance with a preferred embodiment of the invention.
FIG. 3A illustrates a modification in the hearing aid of FIG. 3.

In order to understand and appreciate the present invention it is necessary to understand the operation of prior art apparatus and its limitations.

Referring now to FIG. 1, there is shown a block diagram of a prior art hearing aid such as that described in connection with FIG. 1 of above-mentioned U.S. Pat. No. 4,271,331. The basic design of the prior art device is a switched push-pull arrangement comprising a pair of analog delay lines 11 and 12 each of which has an input stage to which there is fed an input signal 13 containing audio frequency information based on a speech pattern provided by a microphone (not shown). A clock generator 14 controls the operation of delay lines 11 and 12 via respective clock lines 15 and 16 by determining the clocking-in rate with which the information in input signal 13 is stored.

The stored information is retrieved from the output stage of respective delay lines 11 and 12 at a clocking-out rate also determined by respective clock lines 15 and 16. During this operation, a respective one of a pair of switches 17 and 18, also controlled by clock generator 14, is closed via respective enable lines 19 and 20, to permit the clocking-out of stored information. An amplifier 22 provides an amplified output signal 24.

By virtue of the above-described switched push-pull arrangement, the operation of delay lines 11 and 12 is controlled on an alternate basis in storage and retrieval modes. That is, while delay line 11, for example, is operated via clock line 15 to store current information, delay line 12 is simultaneously operated via clock line 16 and enable line 20 to retrieve the previously stored information waveform through switch 18. The operation is then reversed and repeated with respect to delay lines 11 and 12.

If, for example, the clocking-out rate is half that of the clocking-in rate, the frequency range of the audio output signal 24 is one-half that of the audio input signal 13, since the clocking rate on the output is slower than that on the input by a factor of two. As referred to herein this technique is termed "frequency transposition", and for the example given, the clocking-in/clocking-out rate ratio, herein termed the "transposition coefficient z", is given by the relation $z=2$.

An illustration of the frequency transposition technique is shown in FIGS. 2A-C. In FIG. 2A, input signal 13 provides an information waveform 29 having signal characteristics relating to its amplitude (A) and frequency (f), per characteristic curve 30. The signal frequency component f in waveform 29 established the frequency range of the audio input information. The period of waveform 29 is shown as twice the time interval t0-t1 (2t1), and two complete cycles of waveform 29 occur in the interval t0-t4.

The push-pull switching operation of delay lines 11 and 12 is periodic and is defined as occurring within a periodic interval, here defined as being between t0–t4. That is, storage or retrieval of information waveform 29 occurs within this periodic interval during which delay line 11 is operated in the storage mode, while delay line 12 is operated in the retrieval mode. At the end of the periodic interval t0–t4, the operation reverses with respect to delay lines 11 and 12, such that the former operates in the retrieval mode (interval t4–t8) while the latter operates in the storage mode.

Thus, at the instant of time denoted as t0, waveform 29 is presented to delay line 11 for storage purposes. In the following exemplary discussion, the frequency component of interest is indicated as f and has a frequency of 1000 Hz. Based on the storage capacity of the delay lines 11 and 12, the periodic interval is a function of the clocking-out rate established by the above-mentioned transposition coefficient. This is given by the relationship:

$$\text{\# of storage cells/clocking-out rate} = \text{periodic interval} \quad (1)$$

which yields a periodic interval of 12.8 msec for a 512 storage cell delay line 11 or 12, using a clocking-out rate of 40 kHz.

If, in this example, the transposition coefficient is $z=2$, the clocking-out rate will be slower than the clocking-in rate by a factor of 2.

Therefore, for $z=2$, $$\text{\# of storage cells/clocking-in rate} = \text{periodic interval/2} \quad (2)$$

Accordingly, only the last 50% of the periodic interval t0–t4 is utilized for storage. Thus, the portion 32 (interval t0–t2) of input information waveform 29 is lost at the output stage of delay line 11. However, the portion 34 (interval t2–t4) of waveform 29 remains stored in delay line 11, until the next periodic interval during which it will be retrieved.

In FIG. 2B, stored waveform portion 34 is shown as it is retrieved from delay line 11. This occurs when the push-pull switching operation determines that delay line 11 operates in the retrieval mode, which commences at time t4. The time interval between the beginning of waveform portion 34 (t2) and the time the retrieval operation commences (t4) is defined as the delay interval D1, which is introduced by delay line 11.

When delay line 11 commences operation in the retrieval mode at time instant t4 with respect to waveform 29 in FIG. 2*a*, clock generator 14 governs the clocking-out rate via clock line 15 and enable line 19 to output stage switch 17. Since the transposition coefficient is $z=2$, the clocking-out rate used during the retrieval operation is half that of the clocking-in rate, resulting in a "stretching" of waveform portion 34. This result produces a reduction in signal frequency component f to $f/2=500$ Hz, per characteristic curve 38. The "stretching" effect utilizes 100% of the periodic interval t4–t8 during which delay line 11 operates in the retrieval mode. Thus, the output audio signal 24 produced by the "stretched" waveform 34 of FIG. 2B is heard by the user in a lower audio frequency range.

FIG. 2C illustrates the frequency adaptation technique for the case where the transposition coefficient is given by the relation $z=4$, in which case delay line 11 provides a delay interval D2. Here, only waveform portion 36 (negative lobe during interval t3–t4) has been stored by delay line 11 before the retrieval mode commences.

In this example, only 25% of the periodic interval t0–t4 is utilized for storage. Since the clocking-out rate in this case is slower than the clocking-in rate by a factor of 4, signal frequency component f of information waveform 29 is reduced to $f/4=250$ Hz, per characteristic curve 40. Again, the "stretching" effect is present with 100% utilization of the periodic interval in the retrieval mode.

As stated previously, in the case where the transposition coefficient is described by the relation $z=2$, one-half of information waveform 29 is lost, since waveform portion 32 (interval t0–t2) is not stored by delay line 11. The result is that only 50% of the periodic interval is utilized during storage. This is because only the last portion of the new information remains stored in one of delay lines 11 or 12 when the current information has been completely retrieved from the other one. In the case of the transposition coefficient described by the relation $z=4$, because there is only 25% utilization of the periodic interval during storage, 75% of the information is lost.

In practical terms, the consequence of the information loss resulting from use of transposition coefficients greater than 1 could be critical to speech intelligibility where the speech contains short duration phonemes such as consonants. Such consonants may be lost on a random basis because the push-pull switching operation between delay lines 11 and 12 is not synchronized to frequency changes in the speech waveforms.

In FIG. 3, a schematic block diagram of a preferred embodiment of hearing aid is shown which incorporates a technique for diminishing the adverse effect of information loss due to frequency transposition. This technique involves recovery of information by recirculation of the output of each of delay lines 11 and 12 back to its respective input stage.

As shown in FIG. 3, audio input signal 13 is provided via amplifier 70 to the respective input stage 72 and 74 of each of delay lines 11 and 12, as well as to frequency analyzer 26.

Frequency analyzer 26 determines the input and output clocking rates at which delay lines 11 and 12 are operated. Generally, although the inventive hearing aid is capable of dividing the audio frequency spectrum into various ranges by design of frequency analyzer 26, it is not recommended to divide the spectrum into more than two ranges in order to avoid confusion by the user. The frequency spectrum is usually divided into two ranges, one from 0–2500 Hz corresponding to voiced phonemes (vowels), and one from 2500–8000 Hz corresponding to non-voiced phonemes (consonants). Frequency analyzer 26 determines in which frequency range the weighted average of amplitude of the information waveform lies so as to instruct clock generator 14 to apply the appropriate transposition coefficient as inputted via the external mode selector 28 according to the hearing characteristics of the particular user.

In accordance with the recovery or recirculation technique applied in the embodiment of FIG. 3, a pair of recirculation switches 80 and 82 are provided connecting the output of delay lines 11 and 12 with their respective input stages 72 and 74. Input stages 72 and 74 include respective switches 76 and 78 for coordinating the recirculation technique with the input of new information waveforms. The enabling signals 19 and 20, control recirculation switches 76, 78, 80 and 82 operation through clock generator 14.

During the time interval in which there is no clocking-out operation on a given one of delay lines 11 or 12, the respective one of output stage switches 17 and 18 is open. At this point, the associated one of recirculation switches 80 and 82, together with its counterpart input stage switch 76 or 78, is closed by clock generator 14 to achieve recirculation. During the time interval in which clocking-out occurs via one of clock lines 15 or 16 such that information is retrieved through the closed one of output stage switches 17 or 18, the appropriate one of input stage switches 76 and 78 is open to prevent the input of new information waveforms.

The result is recirculation of the stored information in the delay line through its input stage, such that a summation of old and new information waveforms is provided to the user. This has the effect of smoothing the speech sound such that the user is able better to understand the sound created by the waveform combination.

For example, in the case of a word containing consonants such as a plural "s", high signal frequency components are present for only a short duration. As this sound is highly important to speech intelligibility, the recovery technique prevents the possibility of its loss due to frequency transposition. By recirculating this signal frequency component of the information waveform through the delay line via switches 80 and 82, components of the frequency spectrum related to this phoneme are preserved in the output signal.

Figures 4A, 4B, 4C:
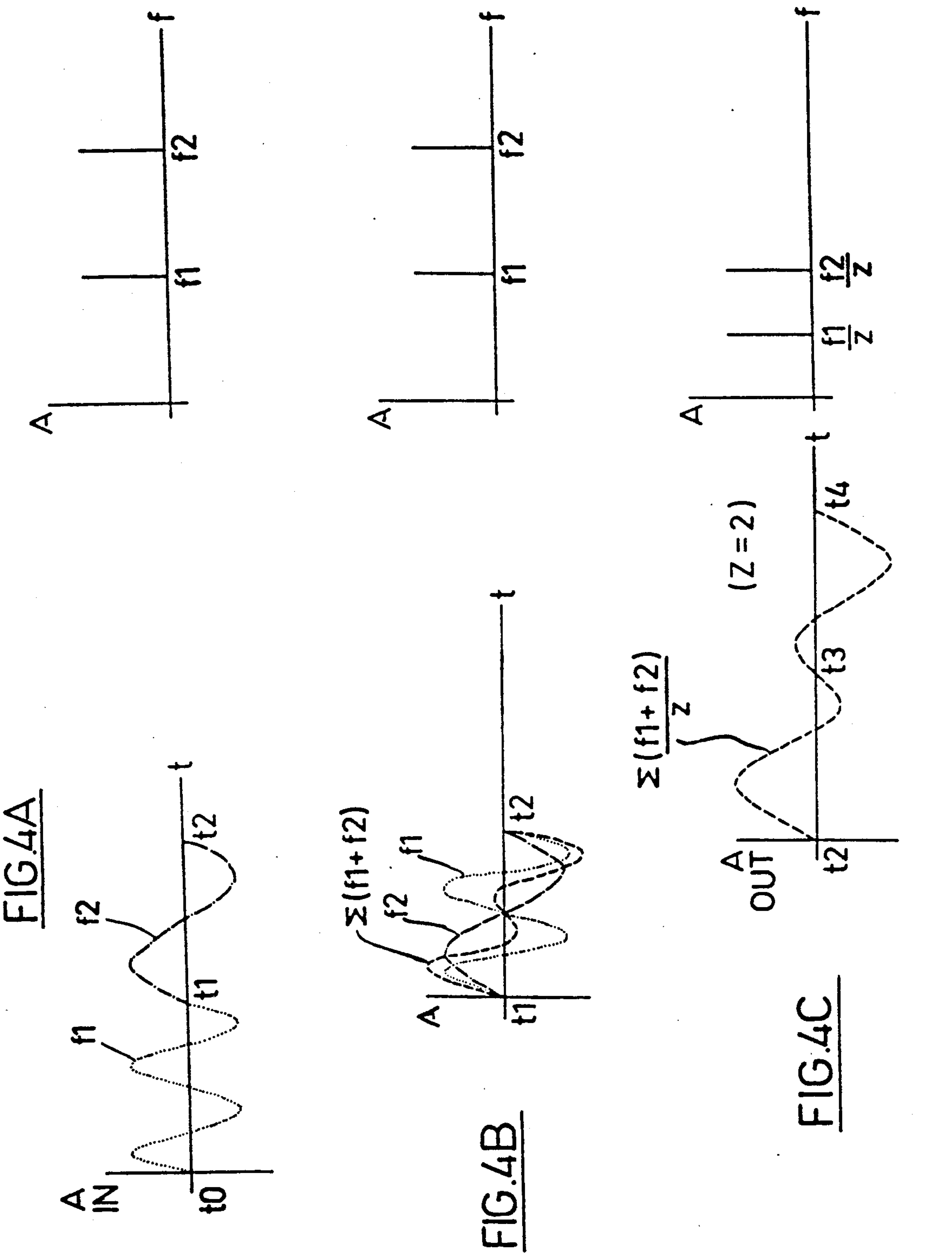
FIG. 4B shows the amplitude and frequency characteristics of the information waveform associated with storage of the input waveform of FIG. 4A.
FIG. 4C shows the amplitude and frequency characteristics associated with output signal produced by the hearing aid of FIG. 3 through frequency transposition of the stored information waveform of FIG. 4B.

An illustration of the recirculation technique is shown in FIG. 4A-C. In FIG. 4A input signal 13 provides an information waveform having two frequency components f1 and f2. The time interval t0-t2, in FIG. 4A, is equivalent to the periodic interval. FIG. 4B shows recirculation of frequency component f1 from the output stage of delay line 11 back to its respective input stage during storage mode. The resulting waveform is a summation of frequency components f1 and f2. The summation of old information f1 and new information f2 is preserved and stored in delay line 11 at the end of the periodic interval. In FIG. 4C the stored information waveform (a summation of frequency components f1 and f2) is shown as it is retrieved from delay line 11 during retrieval mode.

FIG. 3A illustrates a variation in the block 12 (or 11) of FIG. 3. In this variation, instead of using a delay line 11 (or 12) for the storage devices, there is instead used a memory device **11*a* having an analog-to-digital converter 11*b* at its input, and a digital-to-analog converter 11*c* at its output. The analog-to-digital converter 11*b* receives the information from block 72 (or block 74) as described above with respect to FIG. 3, and it, together with its memory device 11*a*, is controlled by the clock line 15 (or 16) as also described above with respect to FIG. 3, such that one storage device (e.g., 11*a*) stores input information at one clock rate while the information is retrieved at the output of the other memory device (11*b***) at a different clock rate determined by the transposition factor.

Figure 5A:
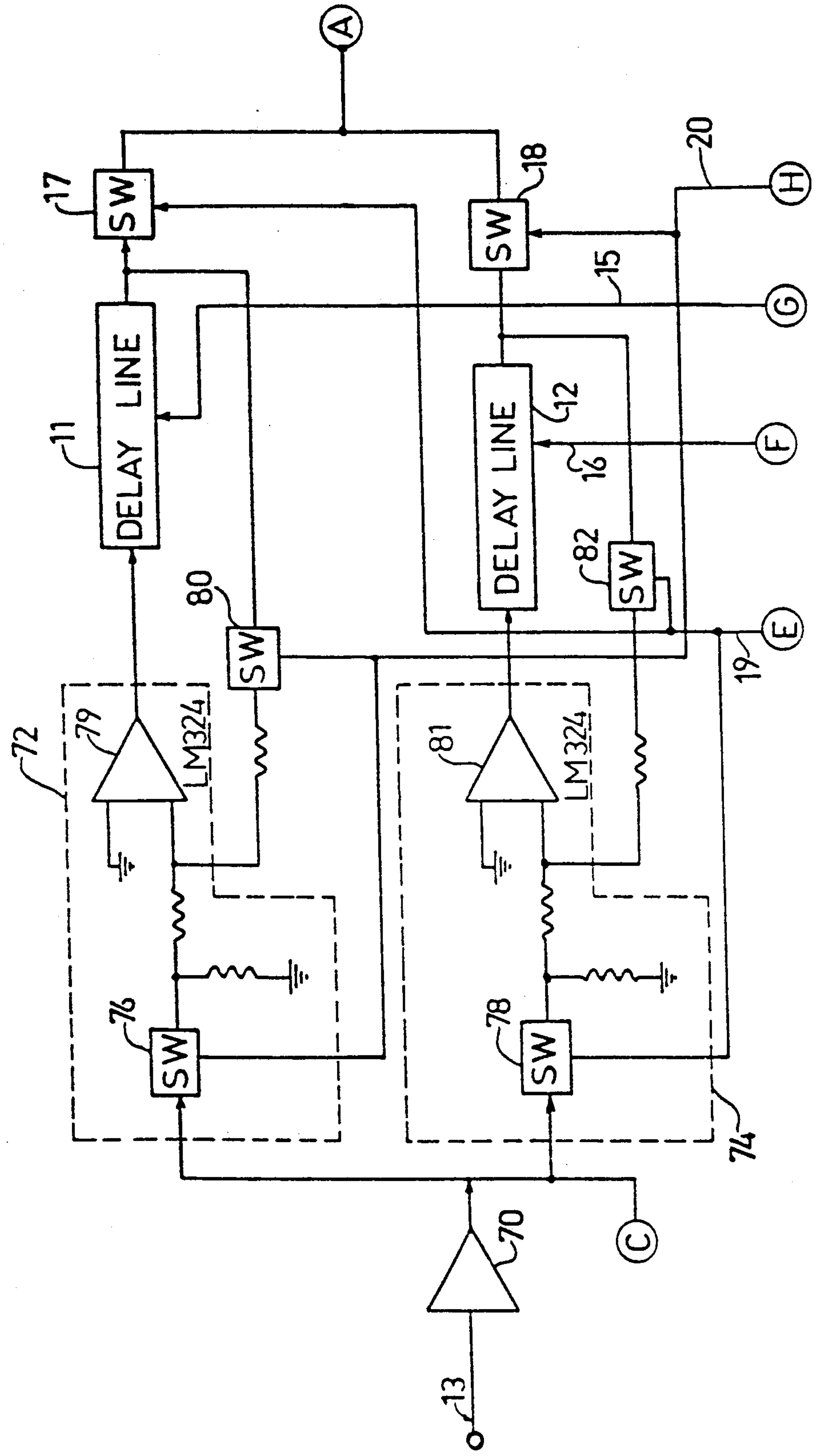
FIGS. 5A-5C together constitute a detailed schematic illustration of the hearing aid of FIG. 3.
Figure 5B:
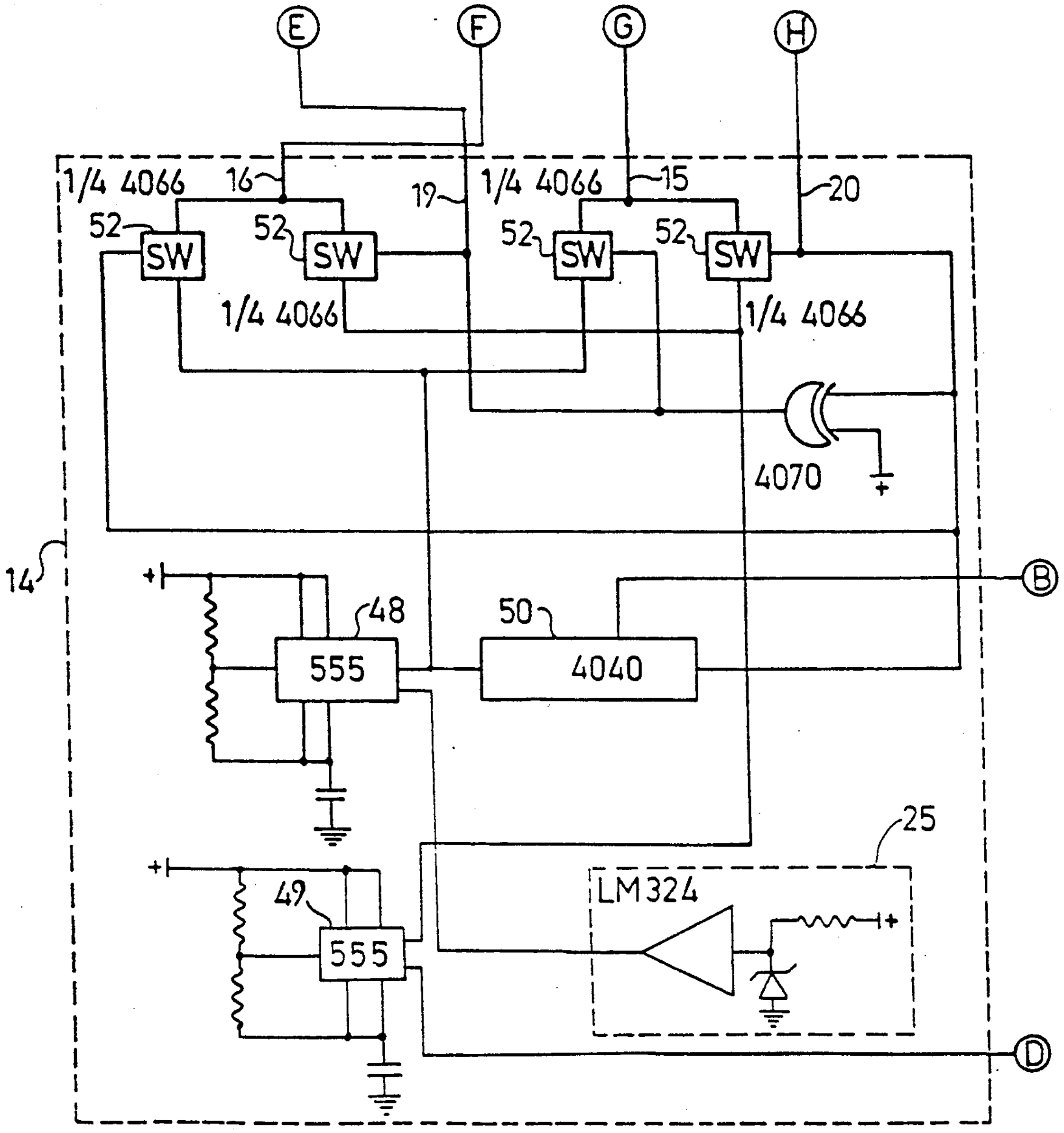
Figure 5C:
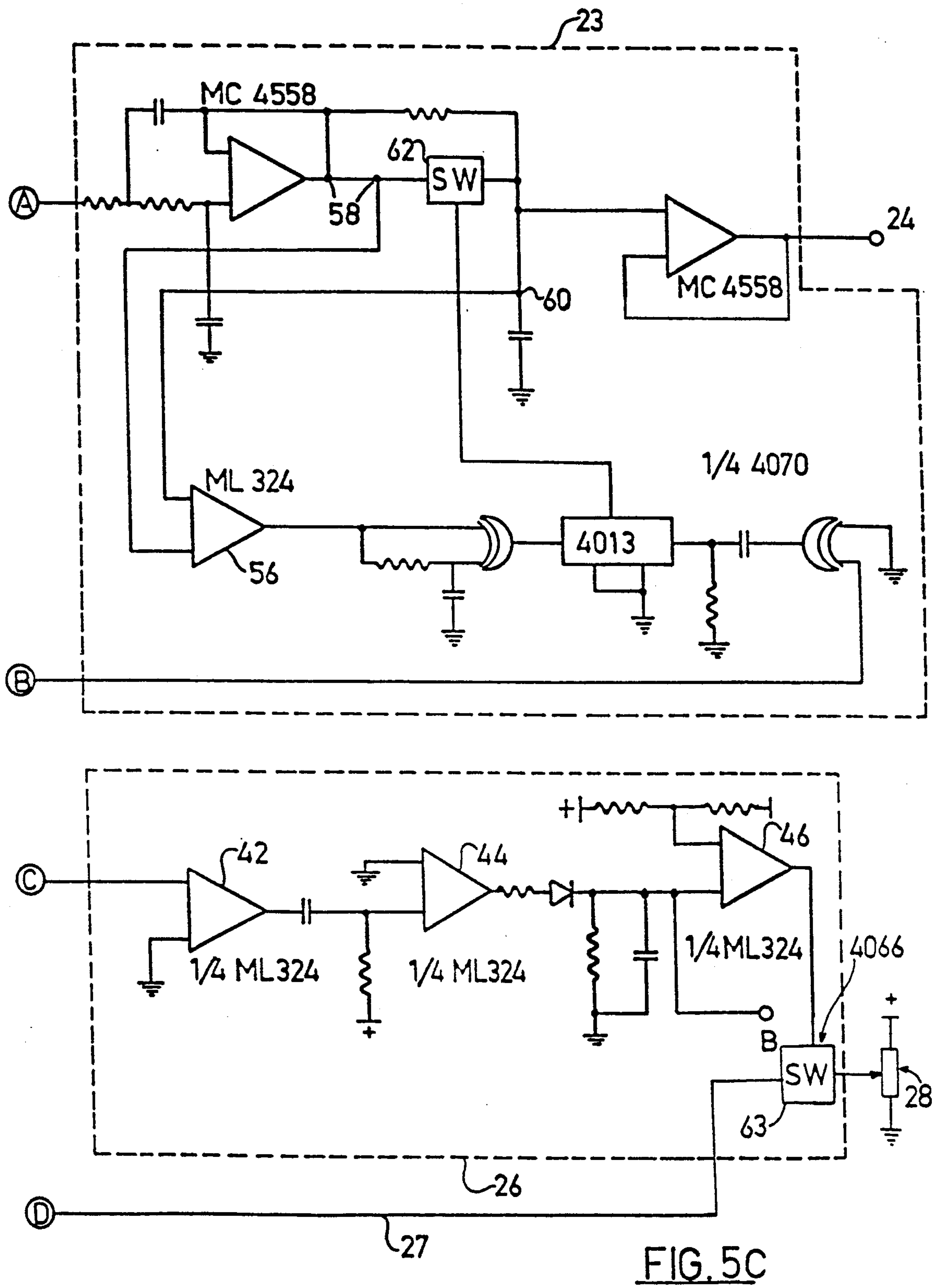

Referring now to FIGS. 5A-5C, there is shown an electronic circuit schematic of the preferred embodiment of FIG. 3. As shown, the inventive hearing aid is designed and constructed in accordance with skill of the art electronic design techniques using CMOS Series 4000 integrated circuits (IC). Typical components used in this design for delay lines 11 and 12 are provided by Reticon IC type RD 5107, with output stage analog switches 17, 18, 76, 78, 80 and 82, provided by IC type 4066.

Amplifiers 79 and 81 are typically type LM324 and provide to respective delay lines 11 and 12 a summation of new information received from input 13 via respective switches 76 and 78 and recirculated information received via respective switches 80 and 82.

Audio input signal 13 is provided to delay lines 11 and 12 and to frequency analyzer 26, the latter comprising voltage comparators provided by circuits 42, 44 and 46, such as IC type ML 324.

Clock generator 14 is comprised of a combination of integrated circuits 48, 49, 50 and 52, circuits 48 and 49 typically being embodied in IC type 555, integrated circuit 50 typically being embodied in IC type ML 4040 and integrated circuit 52 typically being embodied in IC type 4066. The operation of clock generator 14 is based on the frequency determination signal 27 provided as an output by frequency analyzer 26.

Approximator 23 provides a smoothing comparator 56 for attenuating spikes caused by existing voltage differentials between the output levels of delay lines 11 and 12. This is accomplished by comparison of the voltage levels between them at points 58 and 60 and timing the operation of switch 62 to allow switching between them to occur only when the levels are matched.

Output signal 24 is provided as a driving signal to a power amplifier in a final stage (not shown) of the hearing aid, after which it is converted to audio sounds by a suitable transducer.

Figure 6:
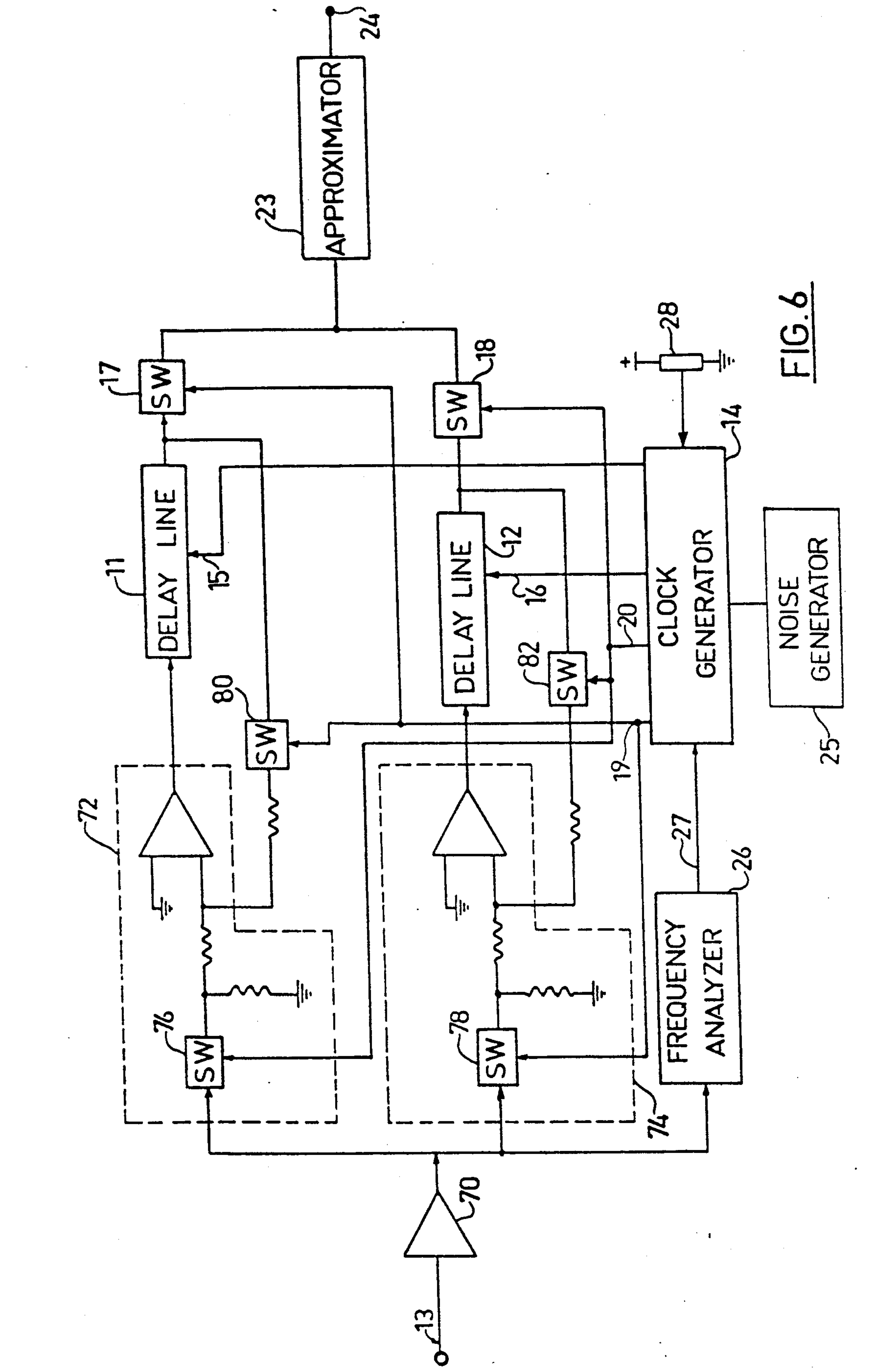
FIG. 6 is a schematic block diagram of a hearing aid constructed and operative in accordance with an alternative embodiment of the invention.

Reference is now made to FIG. 6, which illustrates an alternative embodiment of hearing aid which is similar to that described and shown in connection with FIG. 3 but wherein the frequency transposition is from lower frequencies to higher frequencies in order to accommodate patients having middle range hearing capability.

The circuitry of FIG. 6 is identical to that of FIG. 3 except as specifically noted hereinbelow. Identical reference numerals are employed to denote identical elements for the sake of clarity. In contrast to the embodiment of FIG. 3, the relationship between the clocking rates at which delay lines 11 and 12 operate is reversed, that is the clocking-in rate is lower than the clocking out rate. The transposition coefficient is smaller than one ($z<1$).

It may be appreciated that in this embodiment, it is necessary to provide recirculation of information through the delay lines in order to prevent an intermittent audio output from being presented to the patient. Accordingly, the following structural changes to the circuit of FIG. 3 appear in the circuit of FIG. 6. Whereas enable signal 19 was originally supplied to switch 82, it is no longer supplied thereto but is now instead supplied to switch 80. Whereas enable signal 20 formerly was supplied to switch 80, it is no longer supplied to switch 80 but is instead supplied to switch 82.

In terms of operation, the circuitry of FIG. 6 is identical to that of FIG. 3, except that the clocking in and clocking out rates are reversed and the recirculated speech component is repeated so as to fill in the gaps between clocked out information.

Figure 7:
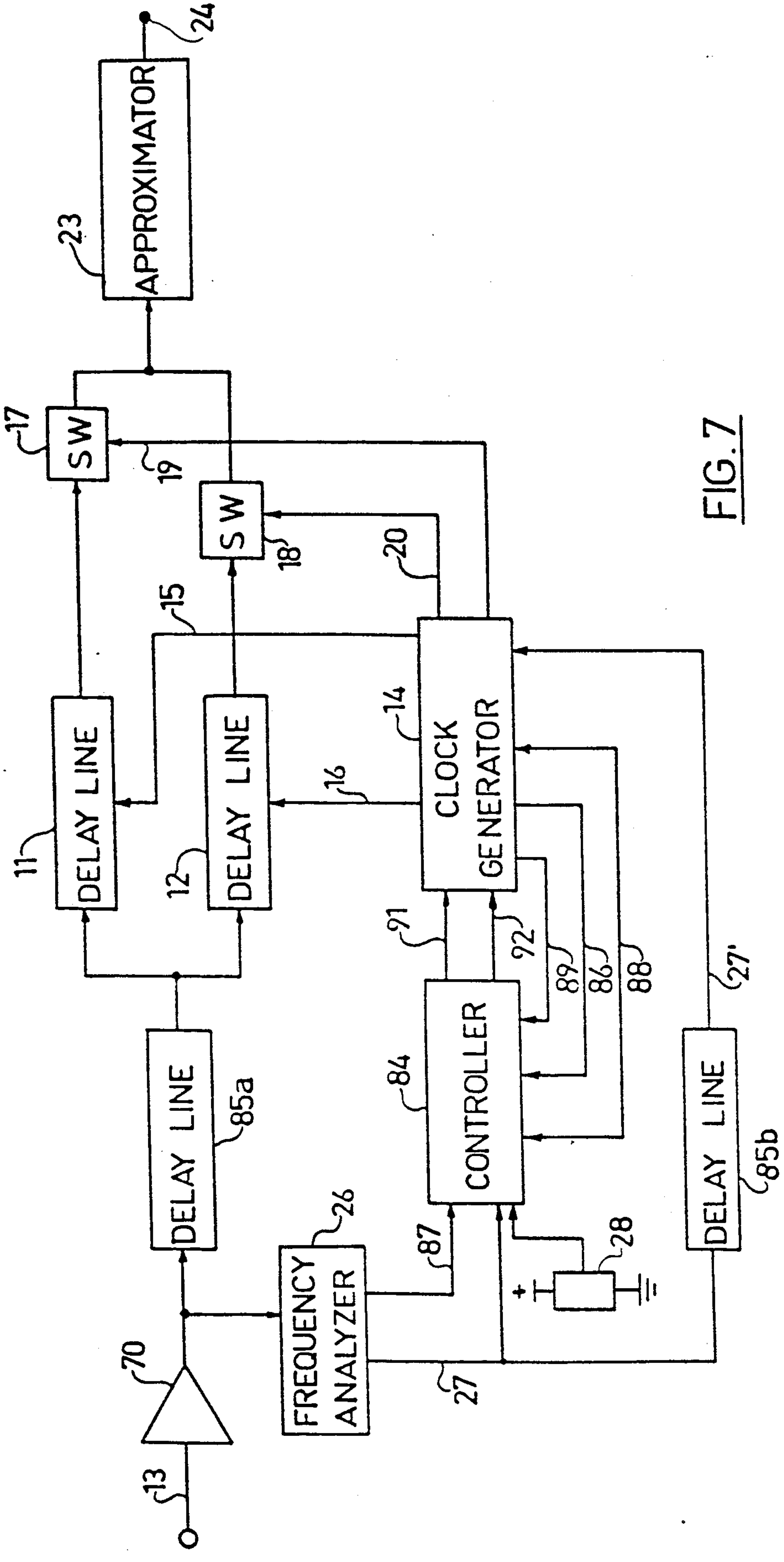
FIG. 7 is a schematic block diagram of a hearing aid constructed and operative in accordance with a further alternative embodiment of the invention.

Referring now to FIG. 7, there is shown a schematic block diagram of another alternative embodiment of the hearing aid of the present invention wherein a reconstruction method is applied to a multi-frequency information waveform to avoid information loss due to frequency transposition. In this approach, multiple signal frequency components in audio input signal 13 are treated individually with regard to frequency transposition so as to provide output signal 24 with a portion of the information relating to each of them, thereby preserving the pattern of the frequency spectrum. The operation occurs in two stages for a given information waveform: advance computation of the necessary parameters of frequency adaptation followed by performance of control functions related to the frequency transposition technique itself.

As shown, the basic schematic block diagram of FIG. 1 has been modified to include components such as a controller 84 and additional delay lines 85*a–b*. Control signals 86 and 87, characteristic signal 88 and clock signal 89 determine controller 84 operation, and controller 84 in turn provides control signals 91 and 92 to clock generator 14, as well as to analyzer 26 and approximator 23.

In general terms of operation, delay line 85*a* introduces an additional delay time interval, equivalent to the push-pull periodic interval, to audio input signal 13. In this delay time interval, frequency analyzer 26 provides control signal 87 in relation to the occurrence of a change of a given size in the frequency of audio input signal 13. In response to frequency determination signal 87, controller 84 reads the external mode selector 28 and obtains the value of z on characteristic signal 88. When control signal 87 is received, controller 84 computes, in relation to z, the necessary time intervals for operation of clock generator 14 with respect to the clocking-in rates supplied on clock lines 15 and 16. The operation of clock lines 15 and 16 is enabled within clock generator 14 by respective internal switches (not shown).

Based on these computations, controller 84 performs control functions relating to frequency transposition in a constant timing sequence established by control signal 86. The frequency transposition coefficient z applied by clock generator 14 in delay lines 11 and 12 per these computations is then appropriately adjusted by frequency determination signal 27′ after the time delay introduced in its counterpart signal 27 by delay line 85*b*. The adjustment of the transposition coefficient for the new signal frequency is determined in controller 84 by frequency determination signal 27 together with characteristic signal 88 containing the value z, so that the necessary portion of the associated information waveform is stored and retrieved.

Figure 8:
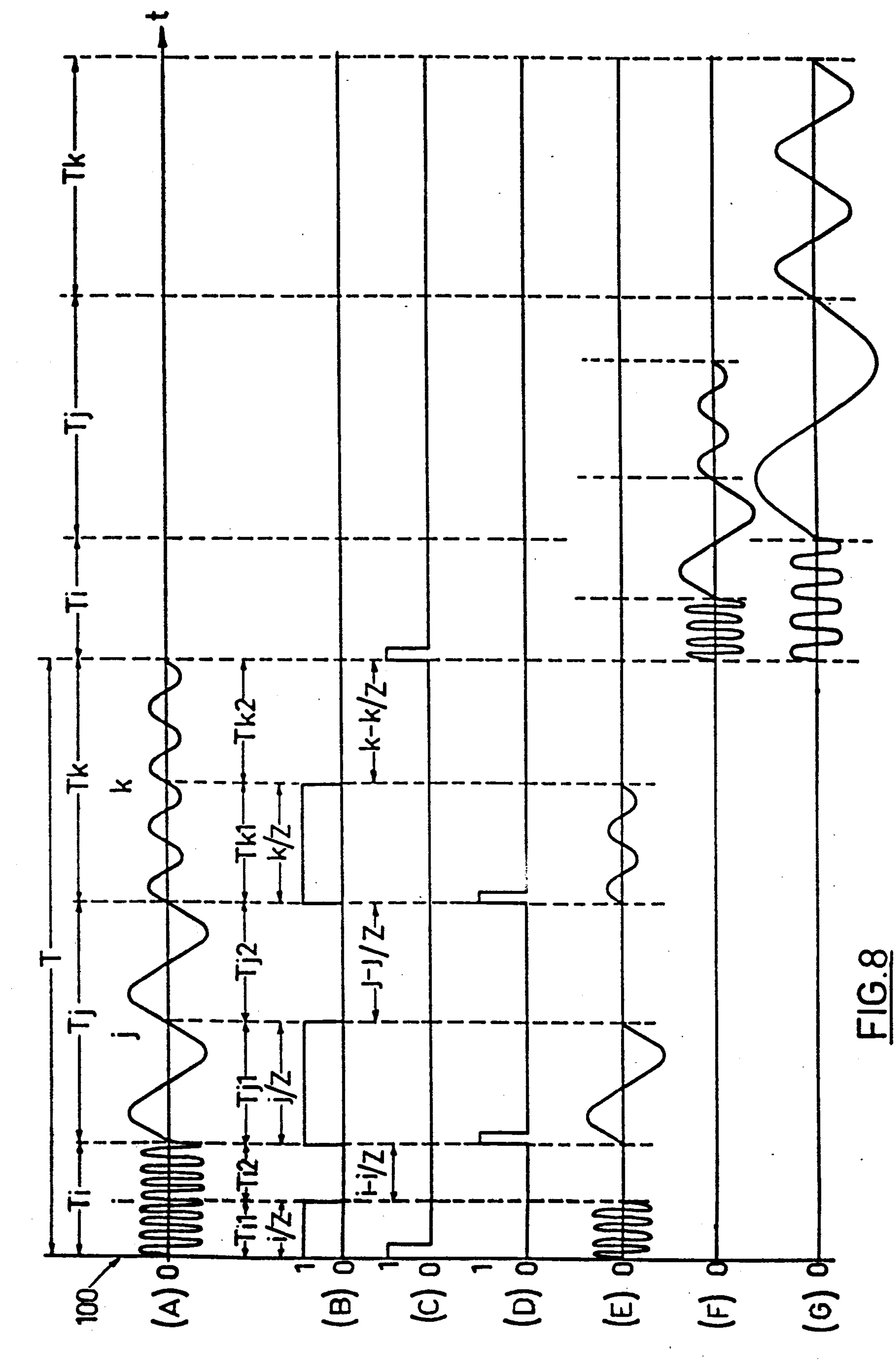
FIGS. 8A-8G are multi-frequency input information waveform and timing diagrams associated with embodiment of FIG. 7.
Figure 9:
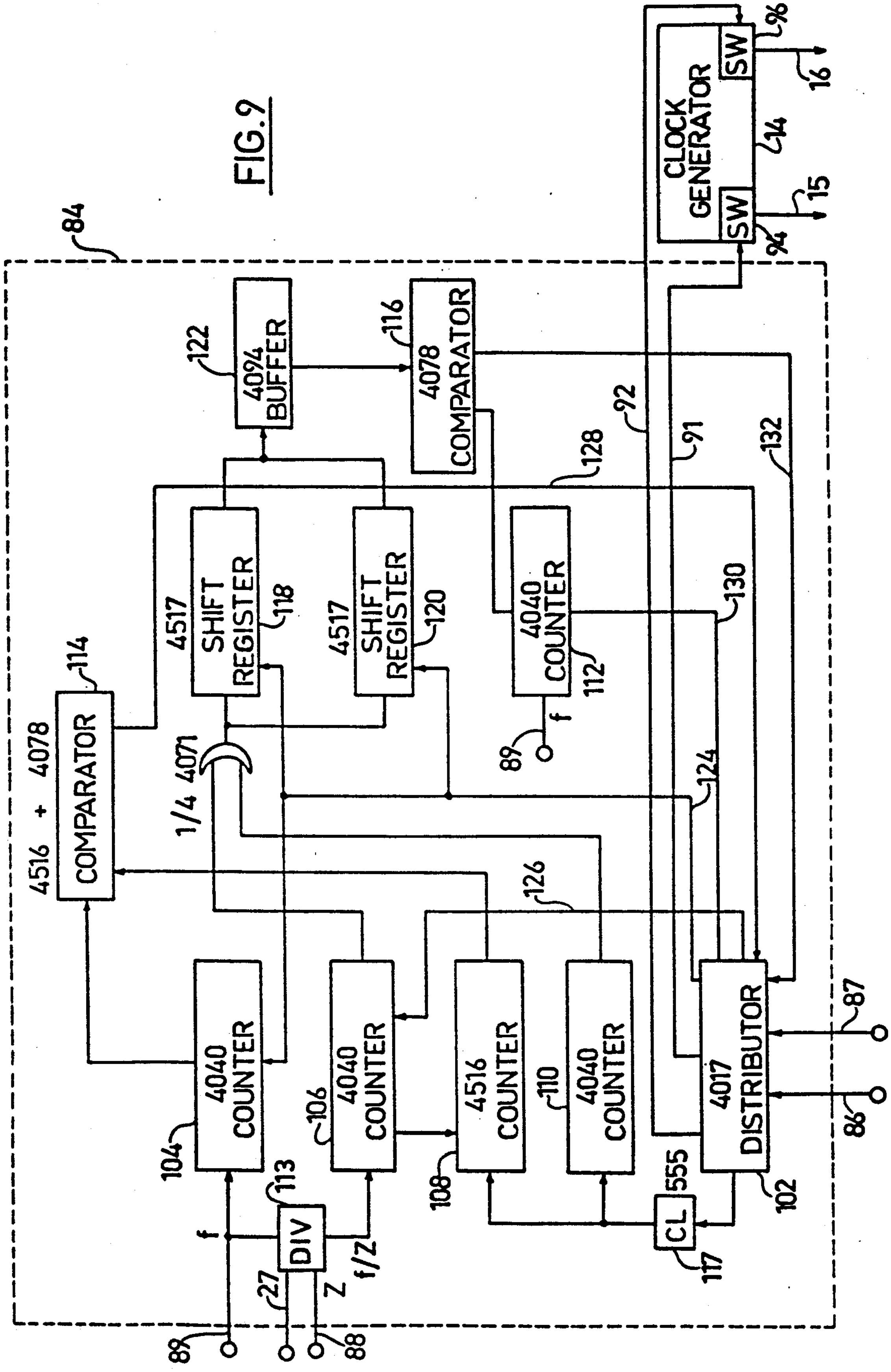
FIG. 9 is a schematic block diagram of a controller portion of the embodiment of FIG. 7.

Turning now to FIGS. 8A–8G, there is shown a multi-frequency input information waveform 100 to which the reconstruction method is applied in the alternative embodiment of FIG. 7. Input waveform 100 in FIG. 8A is provided as audio input signal 13 and comprises portions i, j and k, containing high, low and intermediate signal frequencies, respectively, fi, fj and fk. As shown, portion i of waveform 100 may have a pre-existing portion at the same signal frequency (not shown). In FIG. 8B, segments of the respective input information waveform portions 100*i–k* corresponding to intervals i/z, j/z and k/z are stored for each of the signal frequency components fi, fj and fk appearing therein.

FIG. 8C shows the timing sequence established by control signal 86. FIG. 8D shows the timing of control signal 87, at which point each of the new frequencies fj and fk are first detected. The combination of control signals 86 and 87 eliminate the problems arising from the asynchronous nature of the changes in waveforms 13 with respect to the push-pull switching operation of delay lines 11 and 12. That is, even though the changes in the signal frequency components are random (control signal 87), the timing sequence is fixed by the occurrence of control signal 86.

In this embodiment, the periodic interval T extends for the duration of the individual signal frequency components and is defined as the sum of the intervals in which they occur, namely $$T = Ti1 + Ti2 + Tj1 + Tj2 + Tk1 + Tk2 \qquad (3)$$

In order that output audio signal 24 contain representative signal frequency components present in waveform portions 100*i–k*, the segments of these waveform portions occurring during intervals Ti1, Tj1 and Tk1 must be stored during the clocking-in operation of delay lines 11 and 12, as shown in FIG. 8E. However, the Ti2, Tj2 and Tk2 segments of these information waveform portions will not be stored because clocking-in ceases during these intervals.

For a periodic interval T divided into 256 timing units Tu, and a known range of clocking-in and clocking-out rates between 10 and 40 kHz, a relationship can be developed for the timing of the waveform 100*i–k*. Since the periodic interval T is equivalent to the sum of the intervals containing portions i, j and k, it is true that $$256 * Tu = i + j + k = T \qquad (4)$$

The frequency of the clocking-in and clocking-out rates is related to the inverse of the periodic interval T, so that for the range of clock rates between 10–40 kHz, the periodic interval can be expressed as:

$$(1/10\ \text{kHz}) \geqq Tu \geqq (1/40\ \text{kHz}) \qquad (5)$$

$$\text{or } 0.1\ \text{msec} \geqq Tu \geqq 25\ \text{usec} \qquad (6)$$

Thus, the duration of the periodic interval T can be expressed as $$(256 * 0.1\ \text{msec}) \geqq T \geqq (256 * 25\ \text{usec}) \qquad (7)$$

$$\text{or } 25.6\ \text{msec} \geqq T \geqq 6.4\ \text{msec} \qquad (8)$$

Since in the illustrated example of FIGS. 8A–8G, the transposition coefficient applied to each individual frequency is the same (as given by the relation z=2) the periodic interval utilization for storage will be 50% as with FIGS. 2A–2B. Thus, in FIG. 8F the stored segments Ti1, Tj1 and Tk1 of respective waveforms 100*i–k* are shown, each being one-half the duration of the original waveform. When frequency transposition with this coefficient is performed on the stored segments, the result is a reduction in frequency as shown in FIG. 8G, wherein each of the waveforms is "stretched" to utilize 100% of the periodic interval T defined by the timing sequence.

In operation of the alternative embodiment of FIG. 7, control signal 86 provides controller 84 with the timing sequence of the push-pull switching operation in the case of the multi-frequency information waveform 100*i–k*. The timing sequence established by control signal 86 is equivalent to the periodic interval defined in equation (3). For each frequency component contained within the speech signal, frequency analyzer 26 provides control signal 87 and frequency determination signal 27 to controller 84, which computes the proper duration of the clocking-in interval as a function of the transposition coefficient z provided by characteristic signal 88. The result of the computation is provided by control signals 91 and 92 to clock generator 14, enabling clock lines 15 and 16 via respective internal switches 94 and 96. The entire control procedure is now described with reference to FIGS. 8A–8G and 9, which respectively show a timing diagram and a schematic block diagram of controller 84.

Controller 84 comprises a distributor 102, a set of counters 104–112, divider 113, comparators 114, 116, high frequency clock generator 117, a pair of shift registers 118, 120 and a serial input/parallel output buffer 122. Distributor 102, which may be an IC type 4017, interfaces with external control signal 86 for determining the start of the timing sequence. Counters 104 and 106, both IC types 4040, are provided to determine the elapsed time interval between different signal frequency components in audio input signal 13 as indicated by control signal 87. This is achieved by providing counter 104 with clock signal 89 at a fixed clock frequency fc, while counter 106 is provided with clock frequency fc/z from divider 113 after division by the transposition coefficient "z", introduced by characteristic signal 88 in response to frequency determination signal 27.

When frequency analyzer 26 detects the given size change in the frequency spectrum of the audio input signal 13 signifying the end of waveform portion 100*i* and the beginning of waveform portion 100*j*, it provides a voltage spike to distributor 102 via control signal 87. Corresponding control signals 124 and 126 from distributor 102 are sent to counters 104 and 106 to stop their operation. At this point, counter 104 contains the parameter "i" (FIG. 8A), which is the elapsed time interval for the frequency component "fi" of the 100*i* waveform portion in the audio input signal 13. Similarly, counter 106 then contains the parameter "i/z" (FIG. 8B), which is the time interval needed to establish the segment Ti1 of waveform 100*i* which is to be stored.

Distributor 102 then provides control signals 124 and 126 with instructions by which counter 104 writes its count, parameter "i", in comparator 114, which may be a combination of IC types 4516+4078, while counter 106 writes its count, parameter "i/z", in counter 108, and IC type 4516. A high frequency clock generator 117, IC type 555, is then operated by distributor 102 so as to cause counters 108 and 110 to count up. Since counter 108 now begins counting up from parameter "i/z", it matches parameter "i" stored in comparator 114 when it has counted a parameter equivalent to the difference between parameters "i" and "i/z", expressed as (i−i/z). At this point, counter 110, an IC type 4040, contains this difference, which is the time interval needed to establish the segment Ti2 of the respective waveform 100*i* which will not be stored.

When comparator 114 signals distributor 102 via control signal 128 that difference parameter "i−i/z" has been determined, the parameters "i/z" and "i−i/z" respectively stored in counters 106 and 110 are transferred to one of shift registers 118 or 120, a pair of IC types 4517. Shift registers 118 and 120 are respectively associated with delay lines 11 and 12 and operate in storage and discharge modes to control the delay line clocking operation. This is done by applying the parameters which they have accumulated to control the operation of clock generator 14 via switches 94 and 96, which are toggle switches (IC type 4066) enabling respective clock lines 15 and 16.

When one of shift registers 118 and 120 accumulates its parameters for the segments Ti1, Ti2, Tj1, Tj2, Tk1 and Tk2 occurring in one periodic interval T (FIG. 8A), the other one is being discharged with similar parameters for a multi-frequency waveform occurring previous to waveform 100. The operation of shift registers 118 and 120 complements the switched push-pull delay line operation, so that when one shift register discharges, its associated delay line 11 or 12 stores information during a clocking-in interval.

Thus, once the parameters "i/z" and "i−i/z" are accumulated in shift register 118, for example, control signal 87 causes distributor 102 to repeat the operation of counters 102–110 for the j and k portions of waveform 100, so that all of the parameters are accumulated in shift register 118. Control signal 86 now indicates the end of the periodic interval (FIG. 8C). At this point, control signal 124 indicates that the first accumulated parameter in shift register 118, segment Ti1 (i/z), is to be transferred serially to buffer 122, an IC type 4094, and the parallel output thereof writes this parameter in comparator 116, an IC type 4078. At the same instant, control signal 91 provides switch 94 with a toggle operation so that it enables clock line 15 of clock generator 14.

Distributor 102 now operates counter 112, an IC type 4040, via control signal 130 so that it counts at clock frequency fc per clock signal 89. Comparator 116 compares the count of counter 112 with that of parameter "i/z". Once comparator 116 has established the timing sequence governing the operation of clock generator 14 for segment Ti1 of waveform 100*i*, it signals distributor 102 via control signal 132, such that control signal 124 directs shift register 118 to discharge segment Ti2 (i−i/z) to buffer 122 and comparator 116. At the same instant, control signal 91 toggles switch 94 so that clocking-in via clock line 15 ceases, and counter 112 begins the count with regard to the Ti2 waveform segment.

Thus, after clock generator 14 operates for segment Ti1 (interval "i/z"), it ceases clocking-in of the remaining segment Ti2 of waveform 100*i*. The result is that clock generator 14 applies the clocking-in operation to store only segment Ti1 of waveform portion 100*i* during the time interval "i/z". As shift register 118 is discharged, the same effect is produced with respect to the j and k portions of waveform 100, such that the Tj1 and Tk1 segments are also stored. The retrieval of stored segment Ti1 of waveform 100*i* will be in accordance with the frequency transposition technique illustrated in FIG. 8G. The same technique is applied to stored segments Tj1 and Tk1 of respective waveform portions 100*j* and *k*.

In the above-described controller 84 control procedure, during the time shift register 118 is being discharged and control signal 91 toggles switch 94 to control the clocking-in operation on clock line 15, shift register 120 is being charged. Since the operation of delay line 12 and shift register 120 are complementary, control signal 92 simultaneously enables switch 96 in continuous fashion such that clock line 16 controls retrieval from delay line 12 of information stored during the previous periodic interval.

Figure 10:
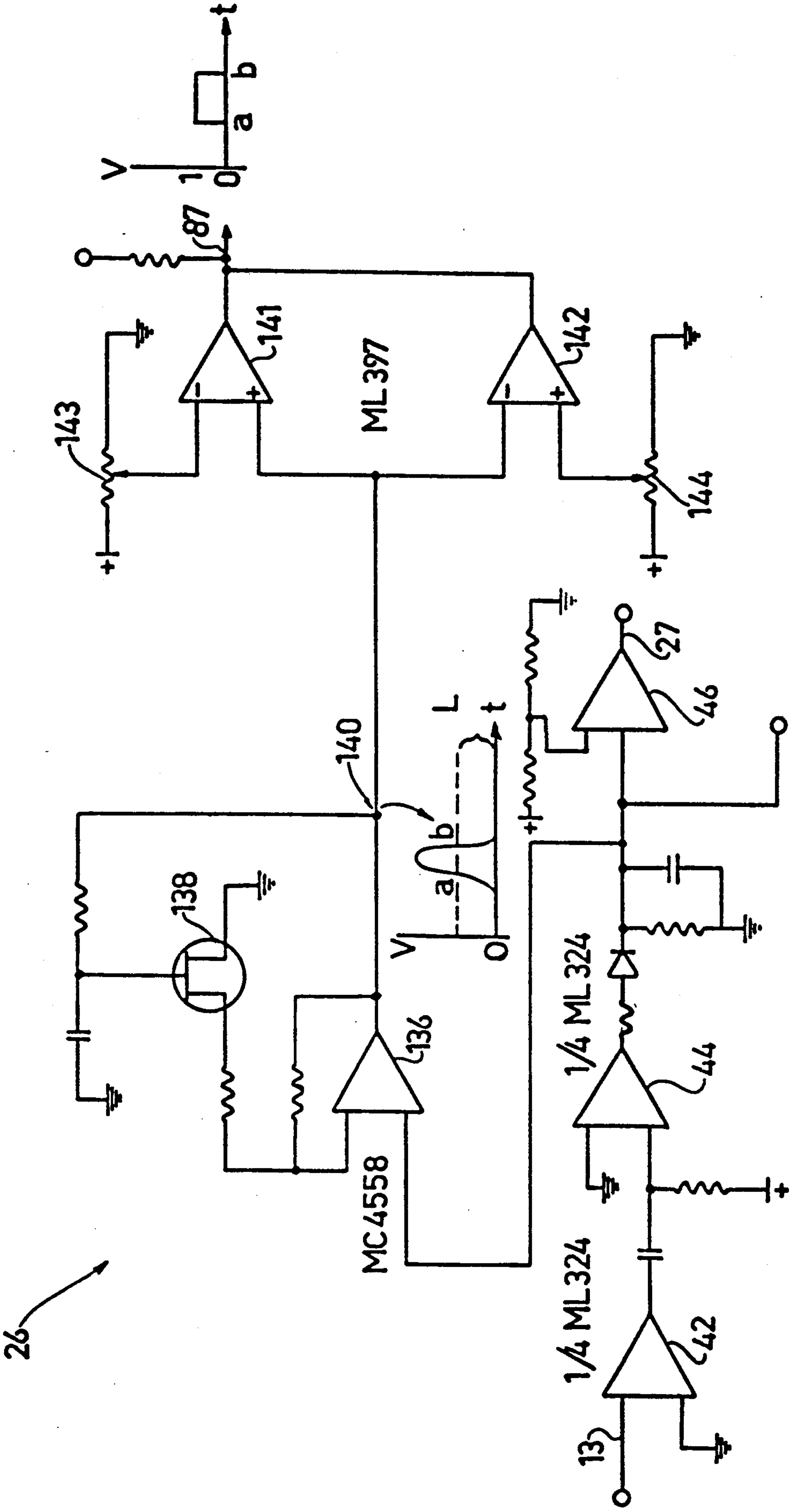
FIG. 10 is a schematic illustration of a frequency analyzer forming part of the circuitry of the embodiment of FIG. 7.

FIG. 10 shows an electronic circuit schematic of a frequency analyzer 26 (incorporating a portion of FIG. 5 frequency analyzer 26) for use in the embodiment of FIG. 7. When a change of a given size in the frequency component of audio signal input 13 is detected by the automatic gain control circuit comprising amplifier 136, an IC type MC 4558, and unijunction transistor 138, a voltage spike is produced at point 140. This voltage spike is then passed via amplifiers 141 and 142, IC types ML 397, as control signal 87 to controller 84.

It will be appreciated by those skilled in the art that frequency analyzer 26 does not provide detection of every change in the signal frequency components of audio input signal 13. However, by adjustment of trimmer resistors 143 and 144, the level of threshold "L" can be adjusted so that the voltage spike at point 140 will produce control signal 87 as shown, thereby determining the size of the change in frequencies for which detection is provided.

Figure 11:
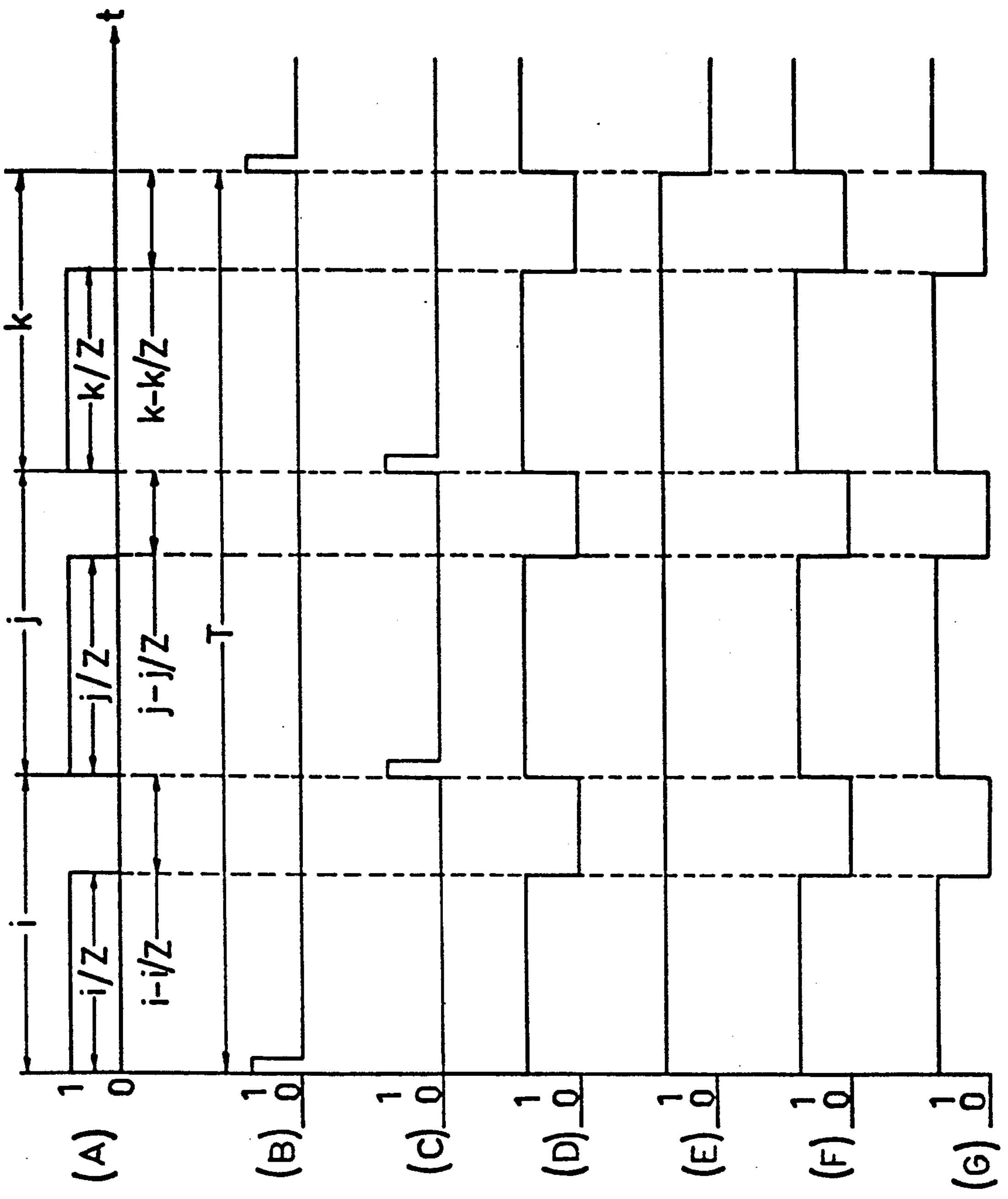
FIGS. 11A-11G are timing diagrams of the operation of the alternative controller embodiment of FIG. 9.

Referring now to FIGS. 11A–11G show timing diagrams of an alternative embodiment of the invention based on the embodiment of FIG. 7, wherein the functions of controller 84 are replaced by a microcontroller, such as a Motorola CMOS type MC68HC05. Using waveform 100 of FIG. 8A, the duration of waveform portions i, j and k is shown in FIG. 11A. These portions are shown as the stored segments i/z, j/z, and k/z, as well as the non-stored segments i−i/z, j−j/z, and k−k/z. FIG. 11B shows the timing of a control signal (equivalent to control signal 86) which starts and ends the timing sequence, which has the duration of the periodic interval T. FIG. 11C shows the timing of a control signal (equivalent to control signal 87) for determining that a given size frequency change has occurred.

For the microcontroller embodiment, the computations necessary to perform frequency transposition are similar to those described in connection with FIGS. 8A–8G and 9, and the results of these computations are stored in a pair of charge and discharge buffers which are used to control the clocking operation performed by clock generator 14 on delay lines 11 and 12. FIG. 11D shows the accumulated input of the charge buffer controlling retrieval of information from one of the delay lines. This buffer accumulates the timing computed to determine the segments i/z, j/z and k/z of waveform 100 which are to be stored in the next cycle. FIG. 11E shows the output of this buffer as a control signal (equivalent to control signal 92) enabling the clock line controlling the clocking-out operation of the associated one of the delay lines.

FIG. 11F shows the accumulated timing of the discharge buffer determining the segments to be stored in the current cycle of the other delay line. FIG. 11G shows the pulse width modulated timing of the discharge buffer described in FIG. 11F, representing a control signal (equivalent to control signal 91) enabling clock line 15 during the clocking-in operation.

FIG. 12 shows a flowchart of an algorithm which may be used to implement the operation of the microcontroller embodiment of FIGS. 11A–11G. The algorithm is interrupt-driven and contains jumps for processing of the parameters controlling the timing sequence. The basic operation begins in block 200 where the system is reset. The value of transposition coefficient z is read in block 202, and in block 204, the microcontroller operation continues.

In block 206, z is checked and the periodic interval begins per the control signal of FIG. 11B. Switching between charge and discharge buffers is controlled by block 208, after which this stage of the process ends in block 210. In block 212, z is checked and the portions of waveform 100 are calculated in accordance with the control signal shown in FIG. 11C. Once computed for the last waveform segment values in block 214, these are stored in the charge buffer and this stage of the process ends at block 216.

Control of the pulse width modulated timing of FIG. 11G begins in block 218, after which the previously computed segments of waveform portions i, j and k are located in block 220 and are fed to timers for each of the waveform segments, via decision blocks 222, 224 and 226. Control of the timers for each of waveform portions i, j and k is handled by respective timer control blocks 228, 230 and 232. Each timer presents its information to block 234 where it is applied to the clock generator and then the next waveform portion is triggered via its respective decision block and timer control block. The end of the cycle occurs in block 236, after the timing is repeated by block 234 for each of the segments of the input waveform.

In summary, the inventive hearing aid provides frequency transposition for enabling a user to hear information from a wide range of audio frequencies within a narrow band of frequencies in which clinical audiometry tests show hearing capability. The particular frequency transposition coefficients and the corresponding range of frequencies for which they are used can be adjusted as needed to achieve the desired results. Information loss is minimized by the use of recirculation, recovery and/or reconstruction techniques based on input audio frequency signal components.

Having described the invention in connection with certain specific embodiments thereof, it is to be understood that the description is not meant as a limitation since further modifications will now suggest themselves to those skilled in the art and it is intended to cover such modifications as fall within the scope of the appended claims.

I claim:

1. Hearing aid apparatus to facilite hearing by a user, comprising:
   - converting means for converting inputted audio frequency sounds to electrical input signals;
   - storage means for storing information associated with said electrical input signals; and
   - control means for controlling the storage means to store information at a predetermined information storage rate and to output the stored information at a predetermined information retrieval rate, the ratio of the information storage rate to the information retrieval rate being termed the transposition coeffecient;
   - said control means including input means for inputting at least two different transposition coefficients predetermined according to the user's hearing characteristics for different frequencies;
   - frequency analyzer means for classifying incoming audio frequency sounds according to their frequency and to select the appropriate transposition coefficient according to the frequency of the incoming signal; and
   - clock generator means for generating clocking signals applied to said storage means at a clock rate determining the information storage rate and the information retrieval rate according to the selected transposition coefficient.

2. Hearing aid apparatus according to claim 1, wherein said storage means comprises a pair of storage devices.

3. Hearing aid apparatus according to claim 2, wherein said storage devices comprise a pair of analog delay lines configured in a switched push-pull arrangement, whereby controlled by said clocking signals such that one delay line stores input information at one clock rate while information is retrieved at the output of the other delay line at a different clock rate.

4. Hearing aid apparatus according to claim 2, wherein said storage devices comprise a pair of memory devices each including an analog-to-digital converter at its input, and a digital-to-analog converter at its output, said memory devices being controlled by said clocking signals such that one memory device stores input information at one clock rate while information is retrieved at the output of the other memory device at a different clock rate.

5. A hearing aid according to claim 1, wherein said control means further includes recirculating means for recirculating information originally stored in the storage means back to the storage means.

6. A hearing aid according to claim 1, wherein said control means is operative to lower the frequencies contained within speech components of said inputted audio frequency sounds by using an information retrieval rate which is less than the information storage rate.

7. A hearing aid according to claim 1, wherein said control means is operative to raise the frequencies contained within speech components of said inputted audio frequency sounds by using an information retrieval rate which is greater than the information storage rate.

8. A hearing aid according to claim 1, wherein said control means further includes reconstruction means for reconstructing the inputted audio frequency sounds while preserving the frequency pattern of such inputted audio frequency sounds by controlling the storage of only portions thereof according to their classification by said frequency analyzer means, the time period of each portion being proportional to the transposition coefficient.

9. A hearing aid according to claim 1, wherein said control means further includes approximator means which is operative to combine the stored information output from said storage means at the time of switching between retrieval and storage in order to smooth the output from said storage means.

10. A hearing aid according to claim 1, wherein said control means further includes a noise generator operative to constantly vary by a small amount said transposition coefficient.

11. Hearing aid apparatus comprising:

converting means for converting inputted audio frequency sounds to electrical input signals;

storage means for storing information associated with said electrical input signals;

and control means for controlling the storage means to store information at a predetermined information storage rate and to output the stored information at a predetermined information retrieval rate;

said control means comprising a frequency analyzer for classifying incoming audio frequency sounds according to their frequency, and recirculating means for recirculating information originally stored in the storage means back to the storage means.

12. The apparatus according to claim 11, wherein said control means is operative to lower the frequencies contained within speech components of said inputted audio frequency sounds by using an information retrieval rate which is less than the information storage rate.

13. The apparatus according to claim 11, wherein said control means is operative to raise the frequencies contained within speech components of said inputted audio frequency sounds by using an information retrieval rate which is greater than the information storage rate.

14. The apparatus according to claim 11, wherein said control means further includes approximator means which is operative to smooth the stored information outputted from said storage means.

15. The apparatus according to claim 11, wherein said control means further includes:

input means for inputting at least two different transposition coefficients representing the ratio of the information storage rate with respect to the information retrieval rate, which transposition coefficients are predetermined according to the user's hearing characteristics for different frequencies;

said frequency analyzer being operative to classify incoming radio frequency sounds according to their frequency and to select the appropriate transposition coefficient according to the frequency of the incoming signal;

said control means further including clock generator means for generating clocking signals applied to said storage means at a clock rate according to the selected transposition coefficient.

16. The apparatus according to claim 11, wherein said control means further includes reconstruction means for reconstructing the inputted audio frequency sounds while preserving the frequency pattern of such inputted audio frequency sounds by controlling the storage of only portions thereof according to their classification by said frequency analyzer means, the time period of each portion being proportional to the transposition coefficient.

17. Hearing aid apparatus comprising:

converting means for converting inputted audio frequency sounds to electrical input signals;

storage means for storing information associated with said electrical input signals;

and control means for controlling the storage means to store information at a predetermined information storage rate and to input the stored information at a predetermined information retrieval rate;

said control means including a frequency analyzer for classifying incoming audio frequency sounds according to their frequency, and reconstruction means for reconstructing the inputted audio frequency sounds while preserving the frequency pattern of such inputted audio frequency sounds by controlling the storage of only portions thereof according to their classification by said frequency analyzer means, the time period of each portion being proportional to the transposition coefficient.

18. The hearing aid according to claim 17, wherein said control means further includes:

input means for inputting at least two different transposition coefficients representing the ratio of the information storage rate with respect to the information retrieval rate, which transposition coefficients are predetermined according to the user's hearing characteristics for different frequencies;

said frequency analyzer being operative to classify incoming audio frequency sounds according to their frequency and to select the appropriate transposition coefficient according to the frequency of the incoming signal;

said control means further including clock generator means for generating clocking signals applied to said storage means at a clock rate according to the selected transposition coefficient.

19. The hearing aid according to claim 17, wherein said control means further includes approximator means which is operative to smooth the stored information outputted from said storage means.

20. The hearing aid according to claim 17, wherein said control means is operative to lower the frequencies contained within speech components of said inputted audio frequency sounds by using an information retrieval rate which is less than the information storage rate.

21. The hearing aid according to claim 17, wherein said control means is operative to raise the frequencies contained within speech components of said inputted audio frequency sounds by using an information retrieval rate which is greater than the information storage rate.

* * * * *